United States Patent
Sasaki

(10) Patent No.: US 9,390,924 B2
(45) Date of Patent: Jul. 12, 2016

(54) METHOD FOR MANUFACTURING SIC SUBSTRATE

(71) Applicant: SHOWA DENKO K.K., Tokyo (JP)

(72) Inventor: Yuzo Sasaki, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/650,596

(22) PCT Filed: Nov. 28, 2013

(86) PCT No.: PCT/JP2013/082024
§ 371 (c)(1),
(2) Date: Jun. 9, 2015

(87) PCT Pub. No.: WO2014/097845
PCT Pub. Date: Jun. 26, 2014

(65) Prior Publication Data
US 2015/0318174 A1    Nov. 5, 2015

(30) Foreign Application Priority Data
Dec. 18, 2012    (JP) .................. 2012-276164

(51) Int. Cl.
| | |
|---|---|
| *H01L 21/302* | (2006.01) |
| *H01L 21/461* | (2006.01) |
| *H01L 21/04* | (2006.01) |
| *C30B 29/36* | (2006.01) |
| *H01L 21/3065* | (2006.01) |
| *C30B 33/00* | (2006.01) |
| *C30B 33/12* | (2006.01) |
| *H01L 21/02* | (2006.01) |
| *H01L 29/16* | (2006.01) |

(52) U.S. Cl.
CPC ............ *H01L 21/0475* (2013.01); *C30B 29/36* (2013.01); *C30B 33/00* (2013.01); *C30B 33/12* (2013.01); *H01L 21/02019* (2013.01); *H01L 21/302* (2013.01); *H01L 21/3065* (2013.01); *H01L 29/1608* (2013.01)

(58) Field of Classification Search
CPC ..................................................... H01L 21/0475
USPC ....................................... 216/52, 38; 438/691
See application file for complete search history.

(56) References Cited

U.S. PATENT DOCUMENTS

| | | |
|---|---|---|
| 5,498,574 A | 3/1996 | Sasaki |
| 2010/0173431 A1 | 7/2010 | Okita et al. |

FOREIGN PATENT DOCUMENTS

JP         7-297187 A       11/1995
(Continued)

OTHER PUBLICATIONS

International Search Report of PCT/JP2013/082024, dated Mar. 4, 2014. [PCT/ISA/210].

*Primary Examiner* — Roberts Culbert
(74) *Attorney, Agent, or Firm* — Sughrue Mion, PLLC

(57) ABSTRACT

A method for manufacturing a SiC substrate is provided. The method includes: a sacrificial film-forming process of forming a sacrificial film on a surface of a SiC substrate in a film thickness that is equal to or greater than a maximum height difference of the surface; a sacrificial film planarization process of planarizing a surface of the sacrificial film by mechanical processing; and a SiC substrate planarization process of performing dry etching under conditions in which etching selectivity between the SiC substrate and the sacrificial film is in a range of 0.5 to 2.0 so as to remove the sacrificial film and so as to planarize the surface of the SiC substrate.

12 Claims, 4 Drawing Sheets

(56) References Cited

FOREIGN PATENT DOCUMENTS

| | | |
|---|---|---|
| JP | 8-167587 A | 6/1996 |
| JP | 2004-168649 A | 6/2004 |
| JP | 2010-135552 A | 6/2010 |
| JP | 2011-103379 A | 5/2011 |
| JP | 2011-146662 A | 7/2011 |
| WO | 2009/031270 A1 | 3/2009 |

METHOD FOR MANUFACTURING SIC SUBSTRATE

CROSS REFERENCE TO RELATED APPLICATIONS

This application is a National Stage of International Application No. PCT/JP2013/082024filed Nov. 28, 2013, claiming priority based on Japanese Patent Application No. 2012-276164, filed Dec. 18, 2012, the contents of all of which are incorporated herein by reference in their entirety.

TECHNICAL FIELD

The present invention relates to a method for manufacturing a SiC substrate.

BACKGROUND ART

As a countermeasure to the global warming problem, an improvement in energy-saving technologies has been demanded. Among the technologies, a power electronics technology of reducing energy loss during power conversion has been regarded as a basic technology. In the related art, a technological improvement of the power electronics technology has been made by using a silicon (Si) semiconductor, but an improvement in performance thereof is getting closer to its limit due to the limit in material properties of silicon. Accordingly, silicon carbide (SiC) having a material property limit higher than that of silicon has attracted attention. For example, silicon carbide has excellent physical properties in which a band gap is approximately three times that of silicon, dielectric breakdown electric field strength is approximately ten times that of silicon, and thermal conductivity is approximately three times that of silicon. Accordingly, application to a power device, a high-frequency device, a high-temperature operation device, and the like has been expected.

Here, as a substrate of a SiC device, a SiC epitaxial wafer is used. The SiC epitaxial wafer is manufactured by forming a SiC epitaxial film, which serves as an active region of the SiC device, on a SiC single crystal wafer (hereinafter, also referred to as "SiC substrate") that is sliced from a SiC bulk crystal (ingot) by a chemical vapor deposition method (CVD method).

To improve characteristics of the SiC device, it is necessary for a surface (hereinafter, also referred as "epitaxial growth surface") of the SiC substrate, which is subjected to epitaxial growth, to have high flatness, smoothness, and the like. Accordingly, high processing accuracy is demanded with respect to a surface of the SiC single crystal wafer that is sliced from the SiC bulk crystal (ingot) so as to realize the high flatness, smoothness, and the like.

To planarize the surface of the SiC substrate that is sliced from the ingot, for example, with respect to a relatively rough surface 11a of a SiC substrate 11 as illustrated in FIG. 9, the surface is planarized by mechanical processing until a height difference disappears as illustrated in FIG. 10. The mechanical processing is typically performed with lap processing in which a processing rate is relatively fast. The lap processing is a processing task in which the SiC substrate is interposed between flat platens, and the surface of the SiC substrate is ground by rotating the platens while supplying a polishing agent. A processing amount at this time may be different depending on a degree of surface roughness or waviness of the surface IIa, and may be approximately several tens of micrometers. During lap processing, when the processing amount is set to perform grinding so as to remove only the original height difference on the surface of the SiC substrate, the surface does not become flat. Accordingly, in a case where the grinding is stopped in the same processing amount as the original height difference, a processing amount increases in subsequent polishing using a diamond abrasive grain. In the polishing using the diamond abrasive grain, a processing rate is slow. Therefore, when the processing amount during polishing increases, a processing time thereof greatly increases. Accordingly, in this process, as illustrated in FIG. 10, it is necessary to perform lap processing in a processing amount that is equal to or more than a height difference of the SiC substrate before processing, and thus this consequently causes an increase in a kerf-loss.

In addition, an affected layer 12 having a thickness of approximately 5 µm to 10 µm is formed in a new surface 12a of the SiC substrate 11 after the lap processing due to an effect of the lap processing. Accordingly, as illustrated in FIG. 11, polishing is performed by using a diamond abrasive grain having a particle size of approximately 1 µm so as to remove the affected layer 12. In the polishing, polishing fabric such as nonwoven fabric is attached to a processing surface of a platen, and a minute polishing agent in comparison to the lapping is used. Accordingly, a processing rate in the polishing is slow, and thus a processing time of approximately several hours is necessary. The reason why such a long time is necessary is because SiC itself has very high hardness in comparison to silicon and the like.

In addition, a new surface 11b of the SiC substrate 11 after polishing is an optically flat mirror surface, but a polishing scratch 11c may occur, and surface damage also exists. Accordingly, chemical mechanical polishing (CMP) surface processing is performed so as to finally form an epitaxial growth surface. In the CMP processing, a processing rate is very slow, and thus a long processing time is necessary to remove the polishing scratch 11c or the surface damage which remains in the polishing with diamond.

As described above, in the related art, it is necessary to form a new surface by removing a surface layer of the SiC substrate over several tens of micrometers (d3) or greater for planarization of the surface of the SiC substrate, and thus a material loss occurs by an amount of SiC that is removed. In addition, the SiC substrate has high hardness, and thus a long time is necessary to perform mechanical processing such as polishing and grinding for planarization.

In addition, when slicing the SiC substrate from the ingot, a loss corresponding to a cutting margin also occurs. Typically, the loss corresponding to the cutting margin and the material loss during previous surface planarization of the SiC substrate are collectively referred to as a kerf-loss. It is necessary to reduce the kerf-loss so as to obtain the SiC substrate from one SiC ingot as much as possible.

As a method for easily removing the affected layer, which occurs during slicing of the wafer from the SiC ingot, at a practical speed, PTL 1 discloses a method for removing a part of the affected layer by a vapor phase etching method.

In addition, as a method for performing planarization while suppressing and removing waviness that occurs during slicing of a wafer from the SiC ingot or during surface grinding, PTL 2 discloses a method in which a curable material is applied to a wafer surface and is cured, and then the curable material and the wafer are collectively ground to planarize the wafer.

CITATION LIST

Patent Literature

[PTL 1] Japanese Unexamined Patent Application, First Publication No. 2004-168649

[PTL 2] Japanese Unexamined Patent Application, First Publication No. 2011-103379

SUMMARY OF INVENTION

Technical Problem

However, even in the method disclosed in PTL 1 or PTL 2, a reduction in the kerf-loss during manufacturing of the SiC substrate, or shortening of time necessary for a surface planarization process is not sufficient.

An object of the invention is to provide a method for manufacturing a SiC substrate which is capable of securing an effective number of SiC substrates collected from a SiC ingot as much as possible by reducing a kerf-loss, and is capable of greatly reducing the time necessary for a planarization process.

Solution to Problem

The present inventors have made a thorough investigation to accomplish the object, and as a result, they have accomplished the invention.

[1] According an aspect of the invention, a method for manufacturing a SiC substrate is provided. The method includes: a sacrificial film-forming process of forming a sacrificial film on a surface of a SiC substrate in a film thickness that is equal to or greater than a maximum height difference of the surface; a sacrificial film planarization process of planarizing a surface of the sacrificial film by mechanical processing; and a SiC substrate planarization process of performing dry etching under conditions in which etching selectivity between the SiC substrate and the sacrificial film is in a range of 0.5 to 2.0 so as to remove the sacrificial film and so as to planarize the surface of the SiC substrate.

[2] According to another aspect of the invention, a method for manufacturing a SiC substrate is provided. The method includes: a sacrificial film-forming process of forming a sacrificial film while adjusting a film thickness of the sacrificial film in order for the entirety of a surface of the sacrificial film to be located at a position higher than a position of the most protruding portion on a surface of a SiC substrate when forming the sacrificial film on the surface of the SiC substrate; a sacrificial film planarization process of planarizing the surface of the sacrificial film by mechanical processing; and a SiC substrate planarization process of performing dry etching under conditions in which etching selectivity between the SiC substrate and the sacrificial film is in a range of 0.5 to 2.0 so as to remove the sacrificial film and so as to planarize the surface of the SiC substrate.

[3] In the method for manufacturing a SiC substrate according to [1] or [2], in the sacrificial film planarization process, the sacrificial film is planarized by grinding, polishing, or CMP.

[4] In the method for manufacturing a SiC substrate according to any one of [1] to [3], in the sacrificial film planarization process, the sacrificial film is planarized without exposing the surface of the SiC substrate.

[5] In the method for manufacturing a SiC substrate according to any one of [1] to [4], a carbon film is used as the sacrificial film, and the carbon film is formed by a sputtering method.

[6] In the method for manufacturing a SiC substrate according to any one of [1] to [5], a SiC substrate that is sliced from a SiC ingot is used as the SiC substrate that is provided to the sacrificial film-forming process.

[7] In the method for manufacturing a SiC substrate according to any one of [1] to [6], after the SiC substrate is sliced from the SiC ingot, the surface of the SiC substrate is preliminarily planarized by mechanical processing before the sacrificial film planarization process.

Advantageous Effects of Invention

According to the invention, it is possible to reduce a kerf-loss during planarization of a surface of a SiC substrate that is sliced from a SiC ingot, and it is possible to greatly reduce time necessary for a planarization process.

DESCRIPTION OF EMBODIMENTS

Hereinafter, a method for manufacturing a SiC substrate according to an embodiment of the invention will be described with reference to the accompanying drawings. FIGS. 1 to 4 illustrate processes illustrating the method for manufacturing the SiC substrate according to this embodiment.

Figure 1:
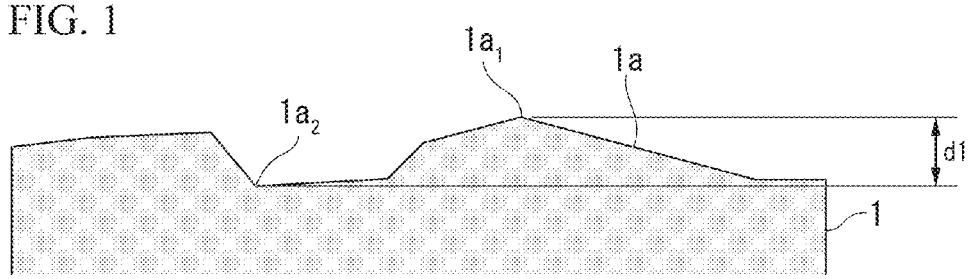
FIG. 1 illustrates a process illustrating a method for manufacturing a SiC substrate according to an embodiment of the invention.

First, as illustrated in FIG. 1, a SiC substrate 1 is prepared. For example, the SiC substrate 1 is a substrate sliced from a SiC ingot, which is manufactured in accordance with a sublimation method, by a cutting process such as wire sawing. A surface 1a of the SiC substrate 1 is a surface formed by the cutting process. Waviness on the surface is relatively large, and surface roughness thereof is relatively large. The surface 1a of the SiC substrate 1 has a maximum height difference d1 between the most protruding portion $1a_1$ and the most recessed portion $1a_2$. For example, the maximum height difference d1 is approximately 30 μm.

In addition, after the SiC substrate 1 is sliced from the SiC ingot, the surface 1a of the SiC substrate 1 may be subjected to a preliminary planarization process by mechanical processing before performing the subsequent sacrificial film-forming process. When only a convex portion is removed, the maximum height difference of the surface 1a of the SiC substrate 1 is reduced to d1' (d1>d1'). According to this, it is possible to shorten a film-forming time in the subsequent sacrificial film-forming process, and an etching time in the subsequent sacrificial film planarization process. As the preliminary planarization process, grinding is preferable to lapping using an abrasive grain. The reason for the preference is as follows. For a reduction in a kerf-loss, it is important that the convex portion be preferentially processed in order for an affected layer not to occur in a concave portion. In addition, with regard to a standard of a processing amount of the preliminary planarization process, when the maximum height difference d1' on the surface 1a of the SiC substrate 1 after the preliminary planarization process is equal to or greater than the thickness of an affected layer, removal is accomplished in a sacrificial film planarization process, and thus an additional kerf-loss does not occur.

Figure 2:
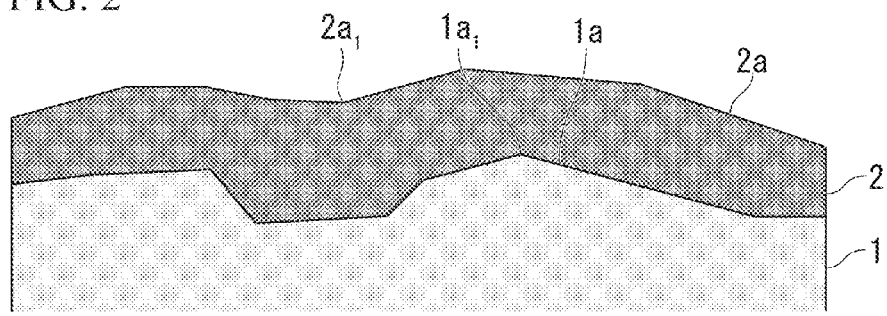
FIG. 2 illustrates a process illustrating the method for manufacturing the SiC substrate according to the embodiment of the invention.

Next, as illustrated in FIG. 2, as a sacrificial film-forming process, a sacrificial film 2 is formed to cover the surface 1a of the SiC substrate 1. For example, the sacrificial film 2 is a carbon film that is formed by a sputtering method. A surface 2a of the sacrificial film 2 becomes an uneven surface that reflects a surface profile of the surface 1a of the SiC substrate 1 to a certain extent. A material of the sacrificial film 2 may be an arbitrary material as long as etching selectivity with respect to SiC during dry etching can be controlled to approximately 0.5 to 2.0. For example, both the carbon film and a silicon film are possible, and the carbon film is particularly preferable. In addition, a method for forming the sacrificial film 2 is different depending on the material of the sacrificial film 2, and methods such as a sputtering method, a deposition method, a CVD method, plating, and spin coating can be employed.

In addition, the sacrificial film 2 may be a single-layer film as shown in FIG. 2, or a multi-layer film. For example, in a case of using an n-layered multi-layer film as the sacrificial film 2, a first layer, a second layer, . . . , an $n^{th}$ film are sequentially laminated on the SiC substrate 1. At this time, in a case of etching the vicinity of an interface between the $n^{th}$ film and the $(n-1)^{th}$ film, etching conditions are selected in such a manner that etching selectivity between the $n^{th}$ film and the $(n-1)^{th}$ film becomes approximately 0.5 to 2.0. Next, in a case of etching the vicinity of an interface between the $(n-1)^{th}$ film and the $(n-2)^{th}$ film after etching the $n^{th}$ film, etching conditions are selected in such a manner that etching selectivity between the $(n-1)^{th}$ film and the $(n-2)^{th}$ film becomes approximately 0.5 to 2.0. In addition, in a case of etching the first film and the SiC substrate 1, etching conditions are selected in such a manner that etching selectivity between the first film and the SiC substrate 1 becomes approximately 0.5 to 2.0. In the above-described cases, etching conditions of respective films which constitute the multi-layer film may be the same as each other or may be different from each other, In addition, with regard to film forming conditions of the sacrificial film 2, it is preferable to adjust the film forming conditions in such a manner that the thickness of the sacrificial film 2 becomes larger than the maximum height difference d1 or d1'. Specifically, the thickness of the sacrificial film 2 is preferably 1.1 times or more the maximum height difference d1 or d1', more preferably 1.2 or more times, and still more preferably 1.5 or more times. In addition, when the sacrificial film 2 is thicker than necessary, time for planarization of the sacrificial film 2 is needed, and thus the thickness of the sacrificial film 2 is two or less times the maximum height difference d1 or d1'.

In addition, with regard to another film thickness condition of the sacrificial film 2, the film thickness of the sacrificial film 2 may be set in such a manner that the entirety of the surface 2a of the sacrificial film 2 is located at a position that is higher than a position of the most protruding portion $1a_1$ on the surface 1a of the SiC substrate 1. That is, the film thickness of the sacrificial film 2 may be set in such a manner that the height of the most recessed portion $2a_1$ on the surface 2a of the sacrificial film 2 is higher than that of the most protruding portion $1a_1$ on the surface 1a of the SiC substrate 1. According to this, it is possible to planarize only the sacrificial film 2 during planarization of the sacrificial film in the subsequent process.

Figure 3:
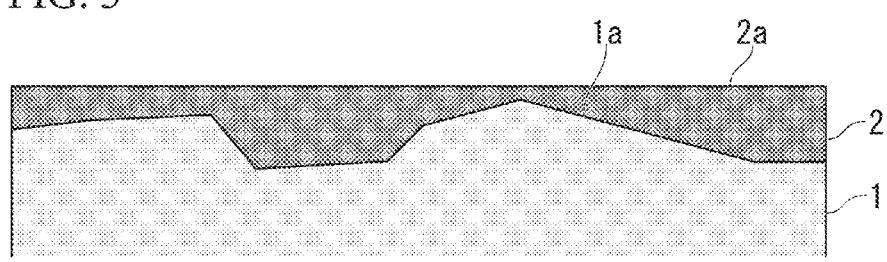
FIG. 3 illustrates a process illustrating the method for manufacturing the SiC substrate according to the embodiment of the invention.

Next, as illustrated in FIG. 3, as a sacrificial film planarization process, the surface 2a of the sacrificial film 2 is planarized by mechanical processing. The mechanical processing may be performed by using several methods such as grinding, polishing, and chemical mechanical processing (CMP). Among these, CMP is preferable, and CMP using colloidal silica as a polishing solution is more preferable. In addition, first, the surface 2a may be ground or polished to planarize the surface 2a to a certain extent, and then CMP processing may be finally performed. The surface 2a of the sacrificial film 2 after planarization is reflected on surface flatness of the final SiC substrate. Accordingly, in this process, it is preferable that the sacrificial film 2 be planarized as much as possible, and for example, surface roughness Ra be preferably set to 0.1 nm or less. In addition, in this process, it is preferable that the sacrificial film 2 be planarized without exposing the surface 1a of the SiC substrate 1. When planarization is performed until the surface 1a of the SiC substrate 1 is exposed, since a processing rate of SiC itself is significantly low, a local load is applied to the exposed SiC substrate, and thus the risk of fracturing or cracking increases. Accordingly, this case is not preferable.

Figure 4:
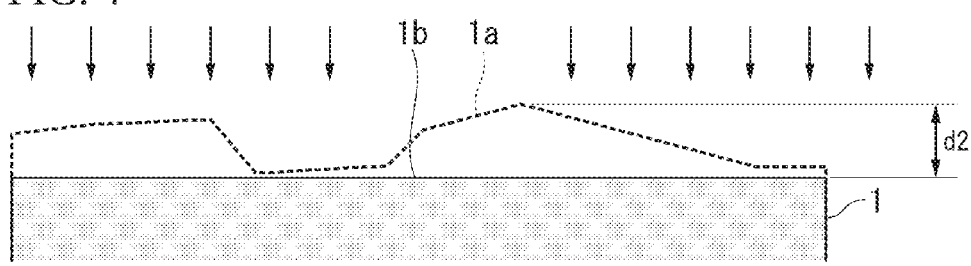
FIG. 4 illustrates a process illustrating the method for manufacturing the SiC substrate according to the embodiment of the invention.

Next, as illustrated in FIG. 4, as a SiC substrate planarization process, dry etching is performed under conditions in which etching selectivity between the SiC substrate 1 and the sacrificial film 2 is in a range of 0.5 to 2.0 to remove the sacrificial film 2 and to planarize the surface 1a of the SiC substrate 1 into a new surface 1b. An etching amount of the SiC substrate 1 is preferably set to an amount d2 that exceeds the maximum height difference d1 (or d1'). With respect to d1 (or d1'), d2 is preferably set to a processing amount of 1 μm, more preferably 2 μm, and still more preferably greater than 5 μm. In addition, at the time of initiating SiC etching, detection is possible by analyzing sputtered atoms by etching.

In dry etching, it is preferable to use reactive ion etching when considering that it is possible to easily adjust the etching selectivity between the SiC substrate 1 and the sacrificial film 2, and it is possible to greatly shorten a processing time until the surface 1a of the SiC substrate 1 is planarized in comparison to the related art. Specifically, a high-density plasma etching method, in which $SF_6$ or $CF_4$ is set as a reactant gas, is preferable, and an effective magnetic field ICP (ISM=inductively super magnetron) type high-density plasma etching method is more preferable. In addition, a magnetron type and the like can be employed as long as the SiC substrate 1 can be etched.

Figure 8:
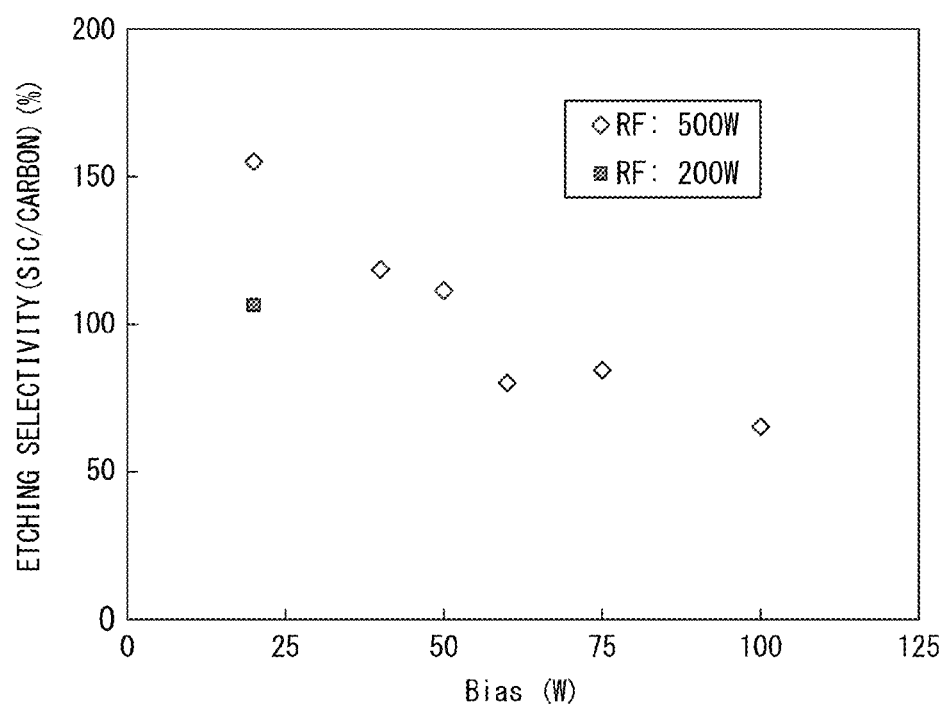
FIG. 8 is a graph illustrating a relationship between bias power and etching selectivity in a dry etching method.
Figure 9:
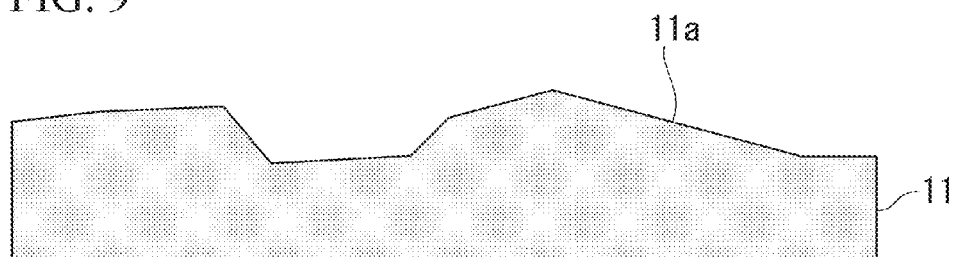
FIG. 9 illustrates a process illustrating a method for manufacturing a SiC substrate in the related art.
Figure 10:
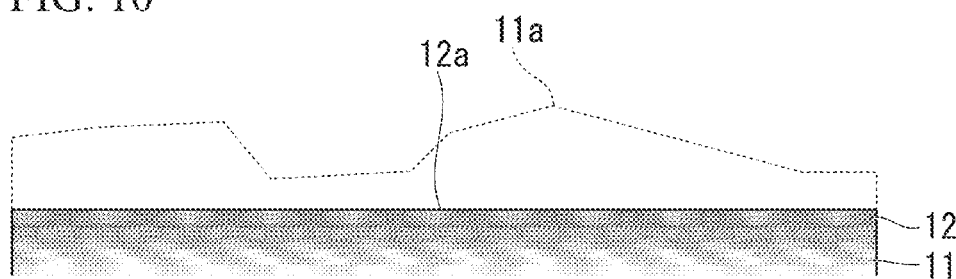
FIG. 10 illustrates a process illustrating the method for manufacturing the SiC substrate in the related art.
Figure 11:
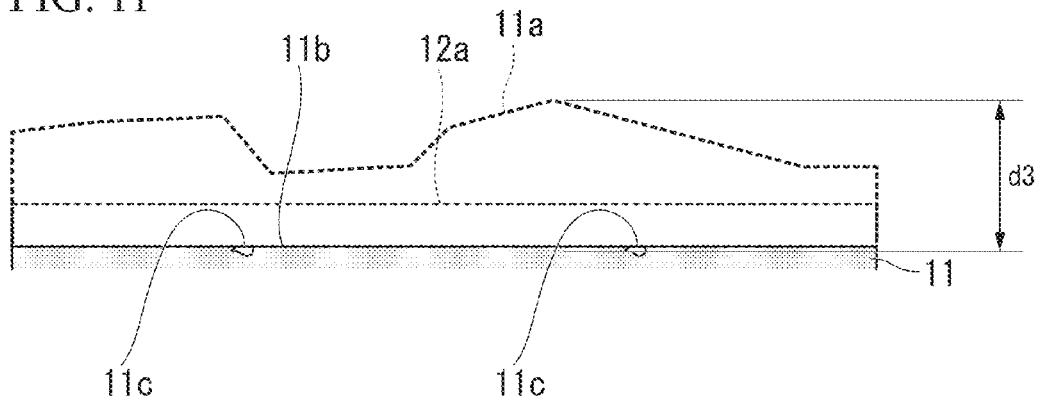
FIG. 11 illustrates a process illustrating the method for manufacturing the SiC substrate in the related art.

When making the etching selectivity between the sacrificial film 2 and the SiC substrate 1 be close to 1, it is effective to adjust various etching conditions such as a reactant gas type, a reactant gas flow rate, a reactant gas pressure, radio frequency power (RF-power), and bias power. Particularly, adjustment of the bias power is preferable when considering that it is possible to easily make the etching selectivity be close to 1. For example, a reactant gas composed of $SF_6$ or $CF_4$ may be used as the reactant gas type, the reactant gas flow rate may be set to 10 sccm to 80 sccm, the reactant gas pressure may be set to 0.1 Pa to 5 Pa, the radio frequency power may be set to 100 W to 900 W, and the bias power may be adjusted in a range of 10 W to 100 W. Particularly, adjustment of the bias power is preferable when considering that it is possible to easily make the etching selectivity be close to 1. FIG. 8 illustrates a relationship between the etching selectivity (SiC/carbon) and the bias power, and it can be seen that when adjusting the bias power, the etching selectively is easily made to be close to 1.

In addition, an etching rate becomes 10 μm/hour or greater in accordance with the conditions, and thus it is possible to greatly shorten the processing time required for planarization of the surface 1a of the SiC substrate 1 in comparison to the related art.

In the reactive ion etching method, when the etching selectivity is adjusted to the vicinity of 1, processing can be performed with almost no change to flatness before processing, and thus if the sacrificial film 2 before processing has a flat surface, the surface 1b of the SiC substrate 1 after processing can be retained as a flat surface. In addition, in direct planarization of the SiC substrate with mechanical processing in the related art, an affected layer occurs. However, in processing using the reactive ion etching method, it is considered that damage to the SiC substrate is nearly negligible. In the reactive ion etching method, two operations including a chemical operation and a physical operation (ion impact) are applied to the SiC substrate 1, and a portion in which interatomic coupling becomes weak due to the chemical operation with respect to a SiC surface is ground by the ion impact. Accordingly, even when damage to the SiC substrate 1 remains due to the reactive ion etching method, the damage merely corresponds to several atomic layers (the order of nm) in which coupling between atoms becomes weak due to a chemical operation, and does not reach several micrometers as in the case of mechanical processing. The damage corresponding to several atomic layers is finally removed by the CMP processing, and thus it is not necessary to provide an additional process of removing the affected layer.

The etching selectivity (SiC/sacrificial film) that is a ratio of an etching rate of SiC substrate 1 to an etching rate of the sacrificial film 2 is preferably in a range of 0.5 to 2.0, more preferably in range of 0.8 to 1.2, and still more preferably in a range of 0.9 to 1.1. In a case where the etching rate of the sacrificial film 2 is much larger than the etching rate of SiC, even when the sacrificial film 2 is planarized with mechanical processing, the sacrificial film 2 is preferentially ground, and thus unevenness is apt to remain on the surface 1b after processing. Accordingly, this case is not preferable. Similarly, in a case where the etching rate of the sacrificial film 2 is much smaller than the etching rate of SiC, unevenness is apt to occur after processing, and thus this case is also not preferable.

After the SiC substrate planarization process, finally, surface processing such as polishing using a diamond abrasive grain having a smaller particle size, and CMP method is performed to form an epitaxial growth surface. In this manner, it is possible to manufacture the SiC substrate 1 having the epitaxial growth surface. In addition, a SiC epitaxial layer is formed on the epitaxial growth surface of the SiC substrate to manufacture a SiC epitaxial wafer.

As described above, according to the method for manufacturing the SiC substrate in this embodiment, the sacrificial film 2 is laminated on the SiC substrate 1 and is planarized. Then, dry etching is performed under conditions in which the etching selectivity between the SiC substrate 1 and the sacrificial film 2 is in a range of 0.5 to 2.0 to remove the sacrificial film 2 and to planarize the SiC substrate 1. Accordingly, the surface profile of the sacrificial film 2 that is planarized is reflected on the surface profile of the SiC substrate 1 after the dry etching, and the surface 1b of the SiC substrate 1 can be planarized. In addition, since the SiC substrate 1 is planarized with the dry etching, it is possible to greatly shorten the processing time in comparison to the planarization processing with the mechanical processing in the related art. In addition, in the dry etching, it is possible to control an etching amount with accuracy of several micrometers, and thus it is possible to suppress the kerf-loss as much as possible.

In addition, since the SiC substrate 1 immediately after being sliced is preliminarily processed, it is possible to reduce a necessary film thickness of the sacrificial film 2, and it is possible to shorten the dry etching time. Accordingly, it is possible to shorten the overall processing time necessary for the planarization of the SiC substrate. In this case, in a case where the maximum height difference d1' after the preliminary processing is equal to or greater than the thickness (about 10 μm) of the affected layer, the affected layer can be removed with the etching, and thus this case is preferable.

EXAMPLES

Comparative Example 1

Figure 5:
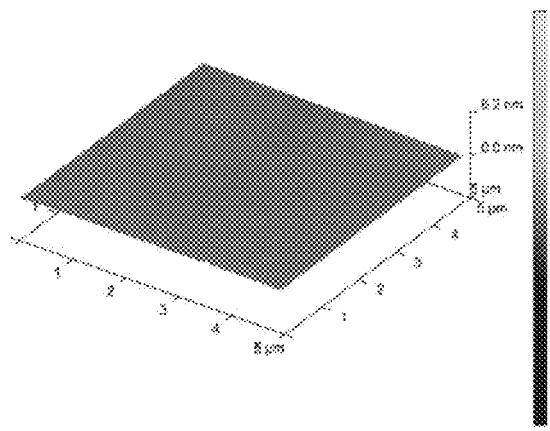
FIG. 5 is a view illustrating results obtained by observing a surface of a SiC substrate, which is manufactured in accordance with a method for manufacturing a SiC substrate in the related art, after CMP processing by using an AFM microscope.

A SiC substrate, which was sliced from an ingot and in which the maximum height difference of the surface was 30 μm, was prepared. The SiC substrate was lap-processed, and was polished by using a diamond abrasive grain having a particle size of 1 μm. Finally, the SiC substrate was CMP-processed to manufacture a SiC substrate from which the affected layer was completely removed. A processing amount in the polishing using the diamond abrasive grain was more than 10 μm. Surface roughness Ra of the SiC substrate after the CMP processing was 0.05 nm. From the result, it could be seen that the surface of the SiC substrate was very flat. FIG. 5 illustrates an AFM image (5 μm square) of the surface of the SiC substrate of Comparative Example 1. Time required for the polishing and the CMP processing in Comparative Example 1 was 12 hours.

Comparative Example 2

Figure 6:
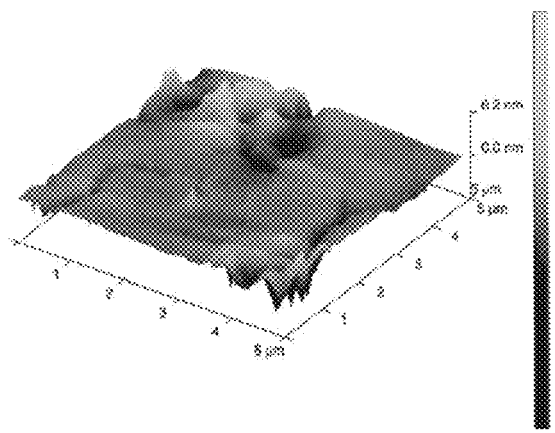
FIG. 6 is a view illustrating results obtained by observing a surface of a SiC substrate, which is manufactured in accordance with a method for manufacturing a SiC substrate in the related art, after CMP processing by using the AFM microscope.

A SiC substrate, which was sliced from an ingot and in which the maximum height difference of the surface was 30 μm, was prepared. The SiC substrate was lap-processed, and was polished by using a diamond abrasive grain having a particle size of 1 μm. Finally, the SiC substrate was CMP-processed to manufacture a SiC substrate. A processing amount in the polishing using the diamond abrasive grain was 3 μm. FIG. 6 illustrates an AFM image (range of 5 μm square) of the surface of the SiC substrate of Comparative Example 2. In Comparative Example 2, the processing amount in the polishing was deficient, and thus the affected layer partially remained even after the CMP processing. In addition, time required for the polishing and the CMP processing in Comparative Example 2 was 9 hours. An amount polished with the diamond abrasive grain decreased, and the polishing time was shortened. Accordingly, the affected layer remained.

Example 1

A SiC substrate, which was sliced from an ingot and in which the maximum height difference of the surface was 30 µm, was prepared.

First, as a preliminary planarization process, the height difference was reduced up to 10 µm with grinding. A sacrificial film composed of a carbon film was formed on the surface of the SiC substrate under conditions in which the film thickness during film formation was set to 12 µm, which was greater than the height difference. The surface of the sacrificial film was polished by using a diamond abrasive grain having a particle size of 1 µm, and was CMP-processed for planarization.

Figure 7:
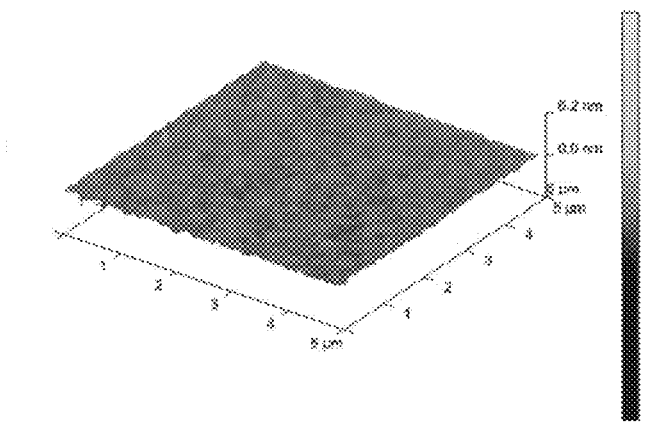
FIG. 7 is a view illustrating results obtained by observing a surface of a SiC substrate, which is manufactured in accordance with a method for manufacturing a SiC substrate of the invention, after reactive ion etching and before CMP processing by using the AFM microscope.

Next, reactive ion etching was performed under conditions in which $CF_4$ was used as a reactant gas, a reactant gas flow rate was set to 40 sccm, a reactant gas pressure was set to 0.5 Pa, a radio frequency output was set to 500 W, and a bias output was set to 50 W, thereby removing the sacrificial film and planarizing the SiC substrate. Under the conditions, etching selectivity (SiC/carbon film), which is a ratio of an etching rate of SiC to an etching rate of the carbon film, was 1.11. Surface roughness Ra of the SiC substrate after the reactive ion etching was 0.1 nm. From the result, it could be seen that the surface was very flat. FIG. 7 illustrates an AFM image (range of 5 µm square) of the surface of the SiC substrate of Example 1. Final CMP processing was performed to accomplish the same surface state as in Comparative Examples. In Example 1, time required for the preliminary planarization, the formation of the sacrificial film, the planarization of the sacrificial film, the reactive ion etching, and the CMP processing was 9.5 hours.

With regard to the required time, one hour was required for the preliminary planarization, one hour was required for sputtering, two hours was required for the sacrificial film planarization, five hours was required for RIE, and 0.5 hours was required for the final CMP processing.

In Example 1, the required time for the planarization was greatly shortened in comparison to Comparative Example 1. In addition, the required time for the planarization in Example 1 was approximately the same as the required time in Comparative Example 2, but the affected layer almost did not remain. In addition, the kerf-loss in Example 1 was approximately 32 µm, and was greatly reduced in comparison to the kerf-loss (55 µm) in Comparative Example 1.

In addition, at an RIE completion stage, the surface in the Example 1 was slightly rough in comparison to the surface in Comparative Example 1. However, the surface roughness Ra was approximately 0.1 nm, and scratches did not occur, and surface damage was little in comparison to the polishing with diamond. Accordingly, in the CMP processing performed for approximately 15 minutes to 30 minutes, it was easy to perform processing up to the same Ra of 0.05 nm as in Comparative Example 1. It was possible to greatly shorten the CMP processing time that was required for approximately hours under the conditions in comparative examples. In addition, the preliminary polishing time was substantially the same as that in the lap processing. Polishing with diamond, which was necessary for 5 to 6 hours under the conditions in Comparative Example 1, was not performed. Accordingly, even when the sputtering, the sacrificial film planarization, and the RIE process were added, the processing time for the overall processes could be shortened.

REFERENCE SIGNS LIST

1: SiC substrate
1a, 1b: Surface
2: Sacrificial film
d1: Maximum height difference

The invention claimed is:
1. A method for manufacturing a SiC substrate, comprising:
   a sacrificial film-forming process of forming a sacrificial film on a surface of a SiC substrate in a film thickness that is equal to or greater than a maximum height difference of the surface;
   a sacrificial film planarization process of planarizing a surface of the sacrificial film by mechanical processing; and
   a SiC substrate planarization process of performing dry etching under conditions in which etching selectivity between the SiC substrate and the sacrificial film is in a range of 0.5 to 2.0 so as to remove the sacrificial film and so as to planarize the surface of the SiC substrate.
2. A method for manufacturing a SiC substrate, comprising:
   a sacrificial film-forming process of forming a sacrificial film while adjusting a film thickness of the sacrificial film in order for the entirety of a surface of the sacrificial film to be located at a position higher than a position of the most protruding portion on a surface of a SiC substrate when forming the sacrificial film on the surface of the SiC substrate;
   a sacrificial film planarization process of planarizing the surface of the sacrificial film by mechanical processing; and
   a SiC substrate planarization process of performing dry etching under conditions in which etching selectivity between the SiC substrate and the sacrificial film is in a range of 0.5 to 2.0 so as to remove the sacrificial film and so as to planarize the surface of the SiC substrate.
3. The method for manufacturing a SiC substrate according to claim 1,
   wherein in the sacrificial film planarization process, the sacrificial film is planarized by grinding, polishing, or CMP.
4. The method for manufacturing a SiC substrate according to claim 1,
   wherein in the sacrificial film planarization process, the sacrificial film is planarized without exposing the surface of the SiC substrate.
5. The method for manufacturing a SiC substrate according to claim 1,
   wherein a carbon film is used as the sacrificial film, and the carbon film is formed by a sputtering method.
6. The method for manufacturing a SiC substrate according to claim 1.
   wherein a SiC substrate that is sliced from a SiC ingot is used as the SiC substrate that is provided to the sacrificial film-forming process.
7. The method for manufacturing a SiC substrate according to claim 1,
   wherein after the SiC substrate is sliced from the SiC ingot, the surface of the SiC substrate is preliminarily planarized by mechanical processing before the sacrificial film planarization process.

8. The method for manufacturing a SiC substrate according to claim 2,
   wherein in the sacrificial film planarization process, the sacrificial film is planarized by grinding, polishing, or CMP.

9. The method for manufacturing a SiC substrate according to claim 2,
   wherein in the sacrificial film planarization process, the sacrificial film is planarized without exposing the surface of the SiC substrate.

10. The method for manufacturing a SiC substrate according to claim 2,
    wherein a carbon film is used as the sacrificial film, and the carbon film is formed by a sputtering method.

11. The method for manufacturing a SiC substrate according to claim 2,
    wherein a SiC substrate that is sliced from a SiC ingot is used as the SiC substrate that is provided to the sacrificial film-forming process.

12. The method for manufacturing a SiC substrate according to claim 2,
    wherein after the SiC substrate is sliced from the SiC ingot, the surface of the SiC substrate is preliminarily planarized by mechanical processing before the sacrificial film planarization process.

* * * * *